United States Patent
Agarwala et al.

(10) Patent No.: US 9,582,421 B1
(45) Date of Patent: Feb. 28, 2017

(54) DISTRIBUTED MULTI-LEVEL CACHING FOR STORAGE APPLIANCES

(71) Applicant: Springpath, Inc., Sunnyvale, CA (US)

(72) Inventors: Sandip Agarwala, Cupertino, CA (US); Shravan Gaonkar, Gainesville, FL (US); Mallikarjunan Mahalingam, Cupertino, CA (US); Smit Shah, Sunnyvale, CA (US); Faraz Shaikh, Sunnyvale, CA (US); Praveen Vegulla, Cupertino, CA (US); Krishna Yadappanavar, Sunnyvale, CA (US)

(73) Assignee: Springpath, Inc., Sunnyvale, CA (US)

( * ) Notice: Subject to any disclaimer, the term of this patent is extended or adjusted under 35 U.S.C. 154(b) by 350 days.

(21) Appl. No.: 14/135,489

(22) Filed: Dec. 19, 2013

Related U.S. Application Data

(60) Provisional application No. 61/739,685, filed on Dec. 19, 2012.

(51) Int. Cl.
  *G06F 12/08* (2016.01)
  *G06F 12/02* (2006.01)
  *G11C 7/10* (2006.01)

(52) U.S. Cl.
  CPC ...... *G06F 12/0811* (2013.01); *G06F 12/0246* (2013.01); *G11C 7/1072* (2013.01)

(58) Field of Classification Search
  CPC .................................................. G06F 12/08
  See application file for complete search history.

(56) References Cited

U.S. PATENT DOCUMENTS

| | | | |
|---|---|---|---|
| 5,692,185 A | 11/1997 | Nilsen | |
| 6,247,139 B1 | 6/2001 | Walker et al. | |
| 6,338,117 B1 * | 1/2002 | Challenger | G06F 12/121 |
| | | | 711/122 |
| 6,928,526 B1 | 8/2005 | Zhu et al. | |
| 7,065,619 B1 | 6/2006 | Zhu et al. | |
| 7,194,492 B2 | 3/2007 | Seidenberg et al. | |
| 7,246,211 B1 | 7/2007 | Beloussov | |
| 7,395,378 B1 | 7/2008 | Pendharkar | |

(Continued)

OTHER PUBLICATIONS

"The Case for Persistent Full Clones," Deepstorage.net, http://getgreenbytes.com/wp-content/uploads/2013/05/FULL_CLONE_PERSISTENT_VDI-FINAL.pdf, 18 pages.

(Continued)

*Primary Examiner* — Kevin Verbrugge
*Assistant Examiner* — Zubair Ahmed
(74) *Attorney, Agent, or Firm* — Blakely, Sokoloff, Taylor & Zafman LLP

(57) ABSTRACT

A distributed multi-layer cache in a distributed storage system is described, where the storage controller functions of the distributed storage system are separated from that of distributed storage system storage media. In an exemplary embodiment, a storage controller server determines if an object is in a cache that stores a plurality of objects. In addition, the distributed storage system includes the cache and a distributed object layer for persistently storing the plurality of objects. The cache further includes a de-duplicated cache layer. The storage controller server accesses the object from the cache if the object is in the cache and accesses the object from the distributed object layer if the object is not in the cache.

15 Claims, 10 Drawing Sheets

(56) References Cited

U.S. PATENT DOCUMENTS

| | | |
|---|---|---|
| 7,467,265 B1 | 12/2008 | Tawri |
| 7,584,338 B1 | 9/2009 | Bicker et al. |
| 7,757,202 B2 | 7/2010 | Dahlstedt |
| 7,953,774 B2 | 5/2011 | Cong et al. |
| 8,190,823 B2 | 5/2012 | Waltermann et al. |
| 8,429,162 B1 | 4/2013 | Wang et al. |
| 8,589,640 B2 | 11/2013 | Colgrove et al. |
| 8,935,302 B2 | 1/2015 | Flynn |
| 9,098,201 B2 | 8/2015 | Benjamin |
| 9,110,792 B1 | 8/2015 | Douglis |
| 9,201,794 B2 | 12/2015 | Gill et al. |
| 9,251,021 B2 | 2/2016 | Calder et al. |
| 2001/0052073 A1 | 12/2001 | Kern et al. |
| 2003/0014599 A1 | 1/2003 | McBreatry et al. |
| 2003/0189930 A1 | 10/2003 | Terrell et al. |
| 2004/0098424 A1 | 5/2004 | Seidenberg |
| 2005/0114402 A1 | 5/2005 | Guthrie |
| 2005/0193272 A1 | 9/2005 | Stager |
| 2005/0268054 A1 | 12/2005 | Werner et al. |
| 2008/0109624 A1* | 5/2008 | Gilbert ............... G06F 12/0284 711/163 |
| 2009/0292746 A1 | 11/2009 | Bricker et al. |
| 2010/0070715 A1 | 3/2010 | Waltermann |
| 2010/0082550 A1 | 4/2010 | Cong et al. |
| 2010/0191783 A1 | 7/2010 | Mason |
| 2010/0198795 A1 | 8/2010 | Chen |
| 2011/0196900 A1 | 8/2011 | Drobychev |
| 2011/0225214 A1 | 9/2011 | Guo |
| 2011/0258480 A1 | 10/2011 | Young et al. |
| 2011/0282842 A1 | 11/2011 | Popovski |
| 2012/0047111 A1 | 2/2012 | Hayden |
| 2012/0210095 A1 | 8/2012 | Nellans |
| 2012/0278512 A1 | 11/2012 | Alatorre et al. |
| 2012/0297142 A1 | 11/2012 | Gill |
| 2012/0303577 A1 | 11/2012 | Calder et al. |
| 2013/0097380 A1 | 4/2013 | Colgrove |
| 2013/0297569 A1* | 11/2013 | Hyde, II ............... G06F 12/0891 707/692 |
| 2014/0047111 A1 | 2/2014 | Petta et al. |
| 2014/0122795 A1 | 5/2014 | Chambliss |
| 2014/0143213 A1 | 5/2014 | Tal et al. |
| 2015/0039717 A1 | 2/2015 | Chiu et al. |

OTHER PUBLICATIONS

Rodeh, Ohad, "B-trees, Shadowing, and Clones," *ACM Transactions on Storage (TOS)* 3, No. 4, https://www.usenix.org/legacy/events/lsf07/tech/rodeh.pdf, (2008), 51 pages.

Rodeh, Ohad, "B-trees, Shadowing, and Clones," *ACM Transactions on Computational Logic*, vol. V, No. N, (Aug. 2007), 26 pages.

VMWare Virtual SAN Hardware Guidance—VMWare, Jun. 2009 https://www.vmware.com/files/pdf/products/vsan/VMware-TMD-Virtual-SAN-Hardware-Guidance.pdf.

Shaoshan Liu et al.,"Parker: Parallel Gargage Collerctor Based on Virtual Spaces", Computers, IEEE Transactions on Year: 2012, vol. 6, Issue: 11, pp. 1611-1623, DOI: 10.1109/TC.2011.193.

Benjamin Zhu, Kai Lai, Hugo Patterson, "Avoiding the Disk Bottleneck in the Data Domain Deduplication File System", http://usenix.org/legacy/events/fast08/tech/full_papers/zhu/zhu_html/index . . . USENIX Fast 2008, Feb. 2008, 16 pages.

Giuseppe Decandia et al., Dynamo: Amazon's Highly Available Key-value Store, http://www.allthingsdistributed.com/files/amazon-dynamo-sosp2007.pdf, SOSP'07, Oct. 14-17, 2007, pp. 205-220, Stevenson, Washington, USA, Amazon.com.

Avinash Lakshman et al.,Cassandra—A Decentralized Structured Storage System, http://www.cs.cornell.edu/projects/ladis2009/, Oct. 10, 2009, 6 pages.

John S. Heidemann et al., File-System Development With Stackable Layers, https://www.ece.cmu.edu/~ganger/712.fall02/papers/stackableFS-Heidemann94.pdf, ACM Transactions on Computer Systems, vol. 12, No. 1 Feb. 1994 pp. 58-89.

\* cited by examiner

DISTRIBUTED MULTI-LEVEL CACHING FOR STORAGE APPLIANCES

RELATED APPLICATIONS

Applicant claims the benefit of priority of prior, provisional application Ser. No. 61/739,685, filed Dec. 19, 2012, the entirety of which is incorporated by reference.

FIELD OF INVENTION

This invention relates generally to a storage system and more particularly to a distributed multi-layer caching in a distributed storage system.

BACKGROUND OF THE INVENTION

Enterprise storage systems currently available are proprietary storage appliances that integrate the storage controller functions and the storage media into the same physical unit. This centralized model makes it harder to independently scale the storage systems' capacity, performance and cost. Users can get tied to one expensive appliance without the flexibility of adapting it to different application requirements that may change over time. For small and medium scale enterprise, this may require huge upfront capital cost. For larger enterprise datacenters, new storage appliances are added as the storage capacity and performance requirements increase. These operate in silos and impose significant management overheads.

Traditionally storage systems implemented a single-level in-memory (like DRAM) cache indexed by the logical offset of the stored content. The advent of flash-based devices (like SSD), which provides fast random performance at a lower price than DRAM made them a good candidate for multi-tier caching. However, most solutions tend to extend the in-memory caching methods to the flash-based caches, which doesn't bode very well with the later. This is because most flash-based devices have poor random write performance and tend to wear out after a certain number of writes. Finally, even though there exists some solutions to distributed caching, they suffer from caching duplicative contents or require complex cache coherency solutions to ensure consistency across difference cache instances. All of the above reduce the effectiveness (cost and performance) of the distributed multi-tier cache.

SUMMARY OF THE DESCRIPTION

A distributed multi-layer cache in a distributed storage system is described, where the storage controller functions of the distributed storage system are separated from that of distributed storage system storage media. In an exemplary embodiment, a storage controller server determines if an object is in a cache that stores a plurality of objects. In addition, the distributed storage system includes the cache and a distributed object layer for persistently storing the plurality of objects. The cache further includes a de-duplicated cache layer. The storage controller server accesses the object from the cache if the object is in the cache and accesses the object from the distributed object layer if the object is not in the cache.

Other methods and apparatuses are also described.

BRIEF DESCRIPTION OF THE DRAWINGS

The present invention is illustrated by way of example and not limitation in the figures of the accompanying drawings in which like references indicate similar elements.

DETAILED DESCRIPTION

Figure 1:
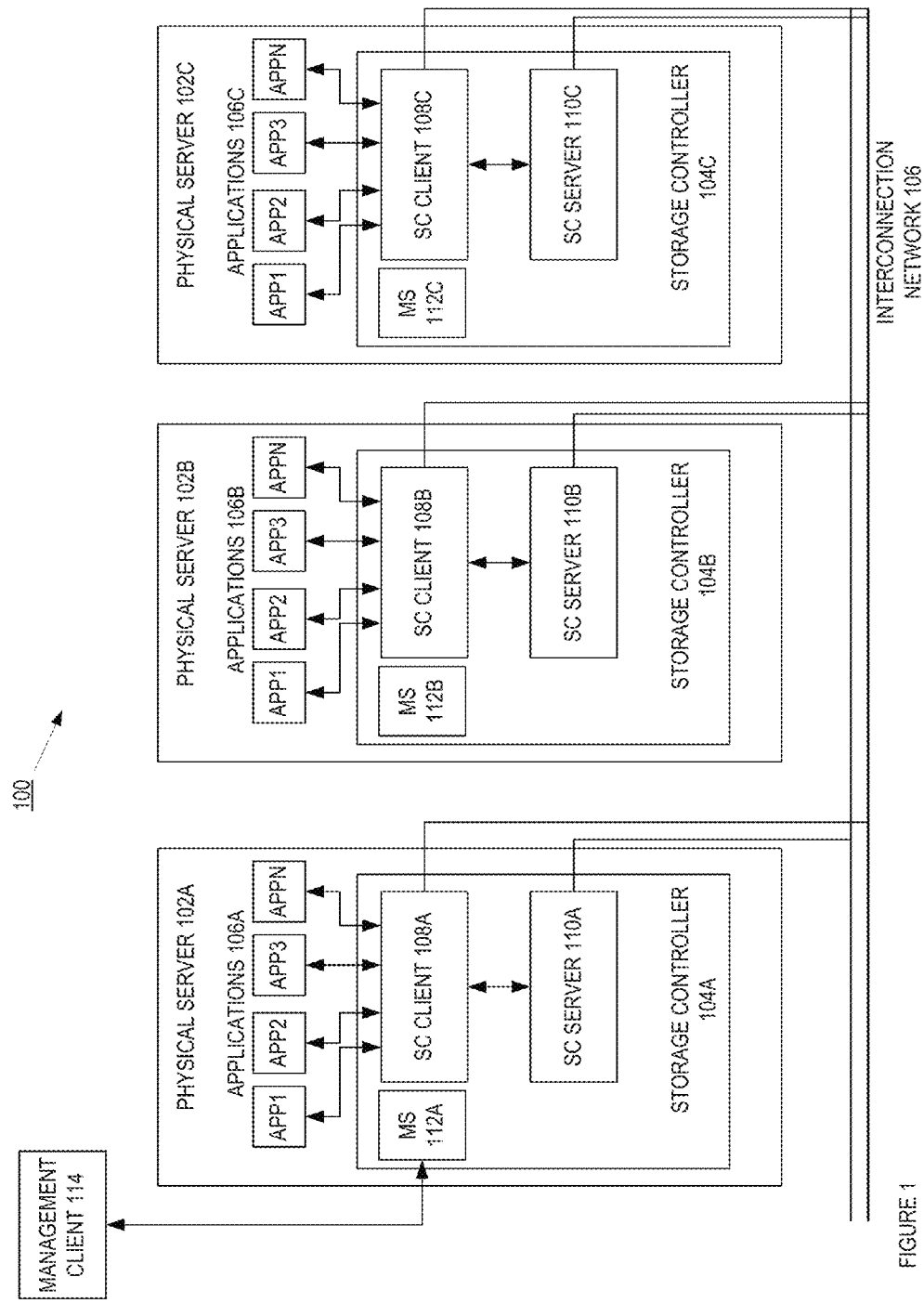
FIG. 1 is an illustration of one embodiment of a high-level view of StorFS system.

A distributed multi-layer cache in a distributed storage system is described, where the storage controller functions of the distributed storage system are separated from that of distributed storage system storage media. In the following description, numerous specific details are set forth to provide thorough explanation of embodiments of the present invention. It will be apparent, however, to one skilled in the art, that embodiments of the present invention may be practiced without these specific details. In other instances, well-known components, structures, and techniques have not been shown in detail in order not to obscure the understanding of this description.

Reference in the specification to "one embodiment" or "an embodiment" means that a particular feature, structure, or characteristic described in connection with the embodiment can be included in at least one embodiment of the invention. The appearances of the phrase "in one embodiment" in various places in the specification do not necessarily all refer to the same embodiment.

In the following description and claims, the terms "coupled" and "connected," along with their derivatives, may be used. It should be understood that these terms are not intended as synonyms for each other. "Coupled" is used to indicate that two or more elements, which may or may not be in direct physical or electrical contact with each other, co-operate or interact with each other. "Connected" is used to indicate the establishment of communication between two or more elements that are coupled with each other.

The processes depicted in the figures that follow, are performed by processing logic that comprises hardware (e.g., circuitry, dedicated logic, etc.), software (such as is run on a general-purpose computer system or a dedicated machine), or a combination of both. Although the processes are described below in terms of some sequential operations, it should be appreciated that some of the operations described may be performed in different order. Moreover, some operations may be performed in parallel rather than sequentially.

The terms "server," "client," and "device" are intended to refer generally to data processing systems rather than specifically to a particular form factor for the server, client, and/or device.

A distributed multi-layer cache in a distributed storage system is described, where the storage controller functions of the distributed storage system are separated from that of distributed storage system storage media. In one embodiment, the StorFS system includes a Deduplicated Object Cache Layer (DOCL), where the DOCL is a multi-level de-duplicated cache that provides a simple and fast access to recently added and/or accessed objects. In one embodiment, the DOCL uses a combination of dynamic random access memory (DRAM) and fast storage devices (solid state drives (SSD), Peripheral Component Interconnect Express (PCIe) Flash, etc.) to cache both data and metadata objects. The cache is designed to have minimal overhead and harness the full capabilities of the hierarchical cache consisting of memory and SSD devices. The DOCL uses a set of techniques to index the objects for fast lookup, track their hotness, read/write objects from/to SSDs efficiently and without deteriorating their life significantly.

In one embodiment, the DOCL includes one or more caching layers to cache both data and metadata. In this embodiment, the DOCL is a multi-layer cache that includes DRAM and fast storage devices (SSD, PCIe Flash); a small overhead for cache metadata, where metadata is in the cache with high probability if the associated data is in the cache; and does not require garbage cleaning overhead for the fast storage devices. In addition, the DOCL includes these functionalities: providing a hierarchical de-duped cache where each level of the caches has different characteristics in terms of performance, power and endurance; providing a simple key-value interface for the consumer of the cache; efficient cache lookup; promotion and demotion of hot and cold objects from different level of caches; DRAM cache replacement logic; mutable logical L0 cache; fast storage device specific L2 cache replacement logic (with no garbage cleaning required); reference counting to prevent eviction of cached objects; and support for variable sized objects.

At a high level and in one embodiment, the DOCL provides an object-based abstraction with a (key, value) interface. The DOCL provides the caching functionality for the Distributed Object Storage layer of the StorFS system. In this embodiment, higher-level applications and/or the file systems may use DOCL to accelerate their read/write performance. On a cache miss, the request for an object will be redirected to the underlying Distributed Object Layer.

In the StorFS system, the stored files are stripped across multiple caching vNodes. In this embodiment, file I/O requests are directed to the appropriate DOCL cache in the distributed system of cluster nodes, thereby presenting a view of a globally unified cache. In one embodiment, a single file can leverage DOCL caches from multiple StorFS nodes.

The cache can operate as a single level DRAM-only cache or as a two-level DRAM-fast storage device cache. In one embodiment, the in-memory cache is a layer 1 (L1) cache and the fast storage device cache is a layer 2 (L2) cache. In addition to L1 and L2 caches, in one embodiment, DOCL can also include a mutable layer 0 (L0) cache that is indexed by logical metadata.

FIG. 1 is an illustration of one embodiment of a high-level view of StorFS system 100. In FIG. 1, the StorFS system 100 includes storage nodes 102A-C coupled by an interconnection network 116. While in one embodiment, three storage nodes 102A-C are illustrated as part of the StorFS system 100, in alternate embodiments, there can be more or less storage nodes. For example and in one embodiment, the StorFS system 100 can include up to several hundred storage nodes. In one embodiment, each storage node 102A-C includes a storage controller (SC) client (also called dispatcher) 108A-C, a storage controller (SC) server 110A-C, or both. The SC servers 110A-C manage their underlying storage (e.g., Hard disk drive (HDD), Solid state drives (SSD), PCIe flash, etc.) and collectively provide reliable and unified storage functionality to the SC clients. The SC client 108A-C processes input/output (I/O) requests from the applications that are local to its physical storage node and routes them to the appropriate SC servers for processing. For example and in one embodiment, SC client 108A can send an I/O request locally to SC Server 110A and/or remotely to SC Servers 110B or 110C. The system is capable of exposing many different interfaces to the application like file (e.g. NFS, CIFS), object, key-value, or another type of interface. In one embodiment, the storage node 102A-C can be server, blade server, personal computer, or any other type of device capable of storing data. In one embodiment, the management server 112A-C is an agent that is used to communicate system management data and commands regarding the corresponding storage node 102A-C with the management client 114.

In one embodiment, the design of the StorFS system 100 distributes both the data and the metadata, and this system 100 does not require storing a complete global map for locating individual data blocks in our system. The responsibility of managing metadata is offloaded to each individual storage nodes 102A-C. In one embodiment, a cluster manager (CRM) resides on each SC Server 110 maintains some global metadata, which is small compared to the local metadata. In one embodiment, each logical file (or entity) is partitioned into equal sized "stripe units". The location of a stripe unit is determined based on a mathematical placement function Equation (1):

$$\text{Virtual\_Node\#} = \text{Hash}(\text{Entity}_{Id}, \text{Stripe\_Unit\#})\%\text{Total\_Virtual\_Nodes}$$

$$\text{Stripe\_Unit\#} = \text{offset}/\text{Stripe\_Unit\_Size}\%\text{Stripe\_Unit\_Per\_Stripe} \quad (1)$$

The $\text{Entity}_{Id}$ is an identification of a storage entity that is to be operated upon, the Total_Virtual_Nodes is the total number of virtual nodes in the StorFS system 100, the offset is an offset into the storage entity, and the Stripe_Unit_Size is the size of each stripe unit in the StorFS system 100. The value Stripe_Unit_Per_Stripe is described further below. In one embodiment, the storage entity is data that is stored in the StorFS system 100. For example and in one embodiment, the storage entity could be a file, an object, key-value pair, etc. In this example, the $\text{Entity}_{Id}$ can be an iNode value, a file descriptor, an object identifier, key/value identifier, etc. In one embodiment, an input to a storage operation is the $\text{Entity}_{Id}$ and the offset (e.g., a write, read, query, create, delete, etc. operations). In this embodiment, the $\text{Entity}_{Id}$ is a globally unique identification.

In one embodiment, the StorFS 100 system receives the $\text{Entity}_{Id}$ and offset as input for each requested storage operation from an application 106A-C. In this embodiment, the StorFS system 100 uses the offset to compute a stripe unit number, Stripe_Unit#, based on the stipe unit size, Stripe_Unit_Size, and the number of virtual nodes that the entity can be spread across, Stripe_Unit_Per_Stripe. Using the stripe unit number and the entity identifier ($\text{Entity}_{Id}$), the StorFS system 100 computes the virtual node identifier. As described below, the StorFS system 100 uses a hash function to compute the virtual node identifier. With the virtual node identifier, the StorFS system 100 can identify which physical node the storage entity is associated with and can route the request to the corresponding SC server 110A-C.

In one embodiment, each vNode is a collection of either one or more data or metadata objects. In one embodiment, the StorFS system 100 does not store data and metadata in the same virtual node. This is because data and metadata may have different access patterns and quality of service (QoS) requirements. In one embodiment, a vNode does not span across two devices (e.g. a HDD). A single storage disk of a storage node 102A-C may contain multiple vNodes. In one embodiment, the placement function uses that a deterministic hashing function and that has good uniformity over the total number of virtual nodes. A hashing function as known in the art can be used (e.g., Jenkins hash, murmur hash, etc.). In one embodiment, the "Stripe_Unit_Per_Stripe" attribute determines the number of total virtual nodes that an entity can be spread across. This enables distributing and parallelizing the workload across multiple storage nodes (e.g., multiple SC servers 110A-C). In one embodiment, the StorFS system 100 uses a two-level indexing scheme that maps the logical address (e.g. offset within a file or an object) to a virtual block address (VBA) and from the VBAs to physical block address (PBA). In one embodiment, the VBAs are prefixed by the ID of the vNode in which they are stored. This vNode identifier (ID) is used by the SC client and other StorFS system 100 components to route the I/O to the correct cluster node. The physical location on the disk is determined based on the second index, which is local to a physical node. In one embodiment, a VBA is unique across the StorFS cluster, where no two objects in the cluster will have the same VBA.

In one embodiment, the cluster manager (CRM) maintains a database of virtual node (vNode) to physical node (pNode) mapping. In this embodiment, each SC client and server caches the above mapping and computes the location of a particular data block using the above function in Equation (1). In this embodiment, the cluster manager need not be consulted for every I/O. Instead, the cluster manager is notified if there is any change in 'vNode' to 'pNode' mapping, which may happen due to node/disk failure, load balancing, etc. This allows the StorFS system to scale up and parallelize/distribute the workload to many different storage nodes. In addition, this provides a more deterministic routing behavior and quality of service. By distributing I/Os across different storage nodes, the workloads can take advantage of the caches in each of those nodes, thereby providing higher combined performance. Even if the application migrates (e.g. a virtual machine migrates in a virtualized environment), the routing logic can fetch the data from the appropriate storage nodes. Since the placement is done at the stripe unit granularity, access to data within a particular stripe unit goes to the same physical node. Access to two different stripe units may land in different physical nodes. The striping can be configured at different level (e.g. file, volume, etc.) Depending on the application settings, the size of a stripe unit can range from a few megabytes to a few hundred megabytes. In one embodiment, this can provide a good balance between fragmentation (for sequential file access) and load distribution.

Figure 2:
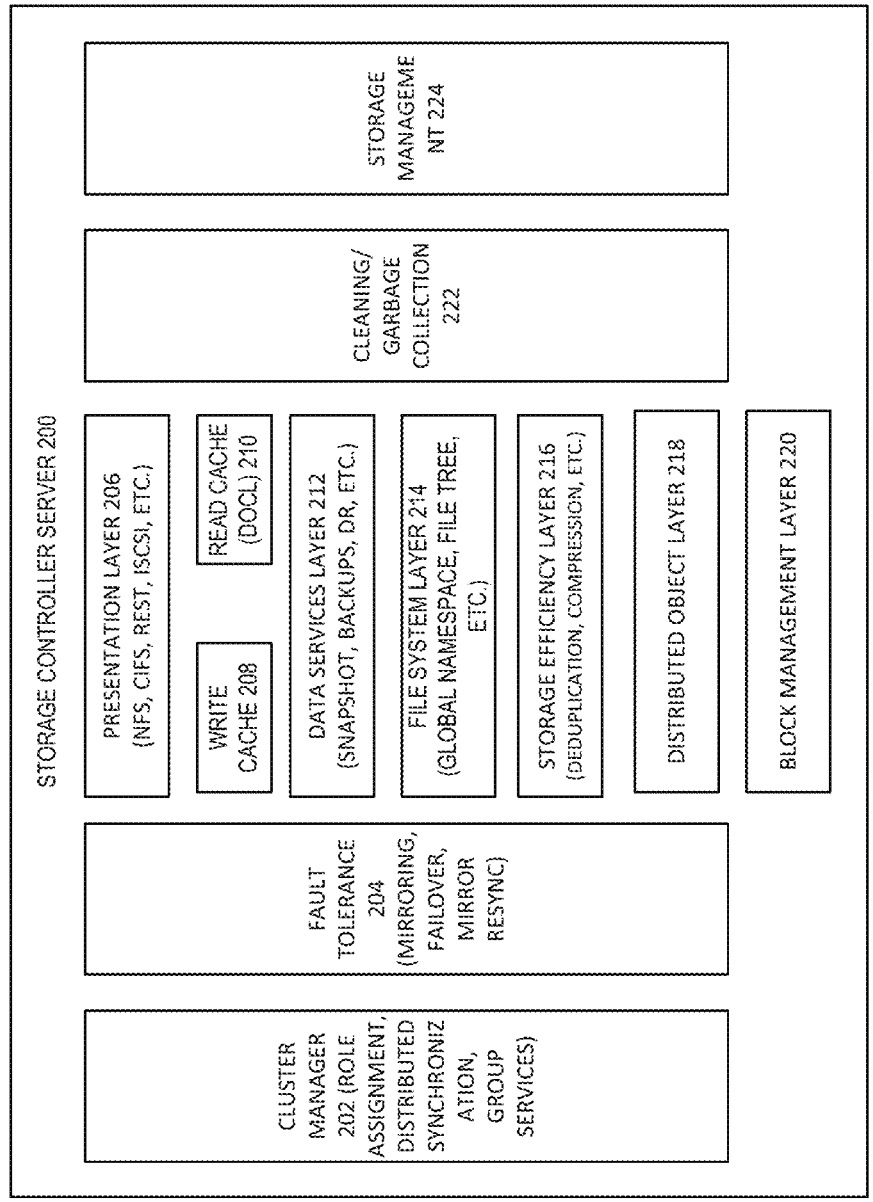
FIG. 2 is an illustration of one embodiment of a system including some of the components that comprises the storage controller server.

FIG. 2 is a block diagram of one embodiment of a storage control server 200. In one embodiment, the Block Management Layer 220 of the storage control server is responsible for formatting, allocating, and freeing storage in fixed block sizes. This layer provides access to different kinds of storage (e.g. SSD, HDD, etc.) in the system. In one embodiment, the Distributed Object Layer 218 of the storage control server uses an API of the Block Management Layer 220 to provide a global distributed object namespace that is accessible over the network. In one embodiment, the Storage Efficiency Layer 216 reduces the size of data footprint on the physical medium using techniques like compression, deduplication, etc. The reduction is achieved without deteriorating the performance or the reliability of the data storage. In one embodiment, the File System Layer 214 provides a logical global namespace abstraction to organize and locate data in the cluster. In one embodiment, the Data Service Layer 212 provides enterprise data services like disaster recovery, fine grained policy management, snapshots/clones, etc. In one embodiment, the Write Cache 208 and the Read Cache 210 Layers provide acceleration for write and read I/O respectively using fast storage devices. In one embodiment, the Write Cache Layer 208 includes the write log as described below. In one embodiment, the Read Cache Layer 210 includes a deduplicated object cache layer (DOCL) that is used to cache recently added and accessed objects for the StorFS system. In one embodiment, the DOCL is a multi-layer cache that is described below. In one embodiment, the Presentation Layer 206 provides an interface to access the StorFS storage using well-known standard protocols like NFS, CIFS, REST, iSCSI, etc. In one embodiment, the Cluster Manager (CRM) Layer 202 is responsible for the coordination across distributed StorFS components, delegating responsibilities and maintaining a consistent global state of the system. In one embodiment, the Fault Tolerance Layer 204 is responsible for resiliency and making sure that the data is available and consistent even after the failure of a software or hardware component (disk, server, network, etc.). In one embodiment, the Garbage Collection Layer 222 is responsible for reclaiming dead space that result due to entities getting deleted or updated. This layer efficiently determines the storage blocks that are not used (or referenced) and makes them available for new data to be written. In one embodiment, the Storage Management Layer 224 provides a framework to configure, monitor, analyze and report on the operation of the overall StorFS cluster storage system as well as individual logical and physical entities in the cluster. In one embodiment, each of the layers mentioned above are fully distributed and each layer does not rely on any centralized components for their operations.

Figure 3A:
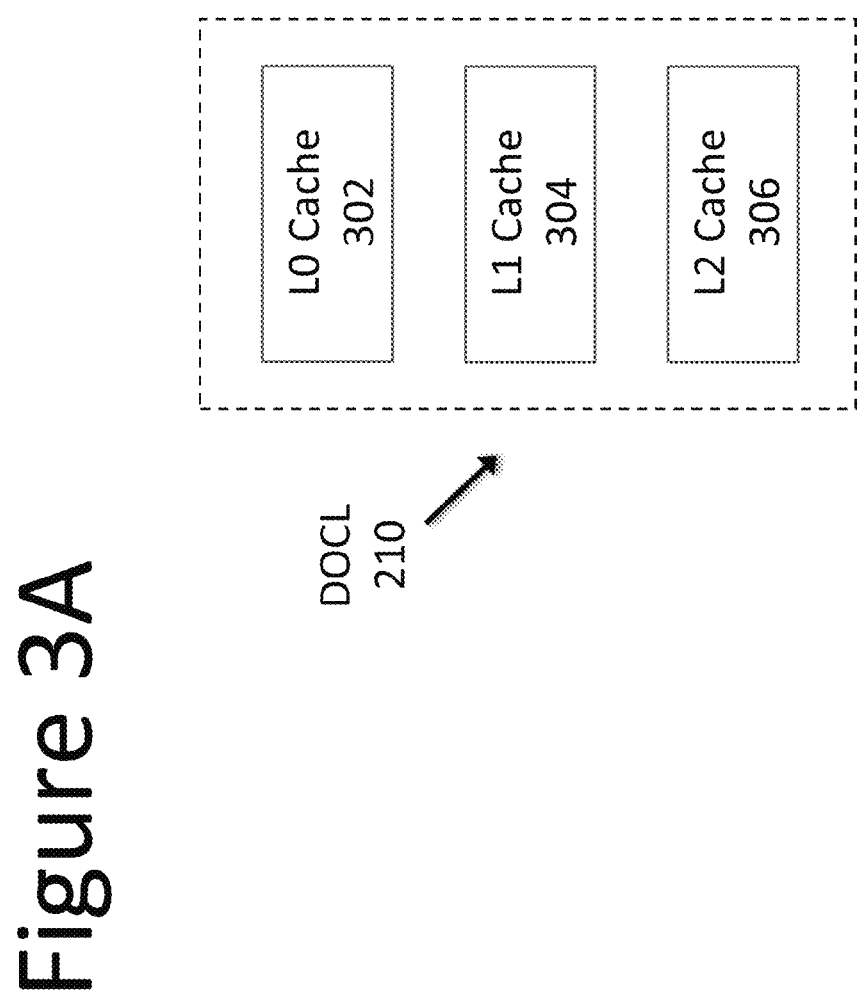
FIG. 3A is a block diagram of one embodiment of a deduplicated object cache layer (DOCL).

FIG. 3A is a block diagram of one embodiment of a DOCL 210. In one embodiment, the DOCL 210 is a caching layer to store recently added and accessed objects and includes three layers: a L0 cache 302, a L1 cache 304, and a L2 cache 306. In one embodiment, the L0 cache 302 is a mutable logical index cache that maintains a mapping of logical metadata to a fingerprint of the objects stored in the L1 cache 304. The L0 cache 302 is further described in FIG. 6 below. In one embodiment, the L1 cache 304 is an in-memory cache that is used to store data and metadata objects and is further described in FIG. 3B below. In one embodiment, the L2 cache 306 is a larger cache that stores the objects grouped by segments and is further described in FIG. 5 below. While in one embodiment, the DOCL 210 is illustrated with these three different layers, in alternate embodiments, the DOCL 210 can include fewer or more layers. For example and in one embodiment, the DOCL 210 may include a single layer (e.g., one of the L0 302, L1 304, L2 306 caches), a combination of layers (e.g., L1 304 and L2 306 caches), and/or additional layers.

In one embodiment, the lookup of objects for the L1 cache 304 is performed using an in-memory hash-table. In this embodiment, instead of using the logical identifier or the address of the object for the hash-table index, the StorFS system uses a fingerprint of the object's content. As a result, the L1 cache 304 is a de-duplicated object cache. In one embodiment, a de-duplicated object cache that stores a single instance of the object in the cache. In another embodiment, this fingerprint-based index also eliminates cache coherency issues and the need to perform cache invalidation. In one embodiment, a hash function is used to compute the fingerprint, such as a SHA-1 or other type of strong collision-resistant hash function as known in the art.

Figure 3B:
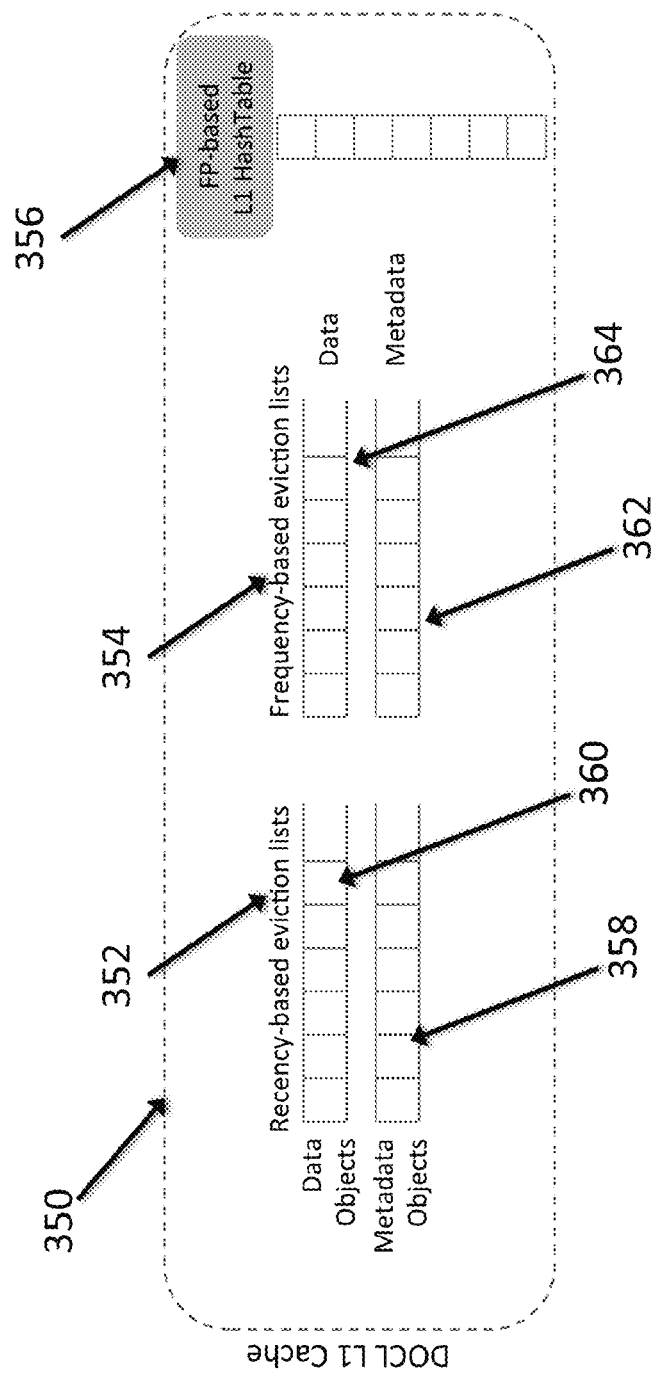
FIG. 3B is a block diagram of one embodiment of a DOCL layer 1 (L1) cache.

FIG. 3B is a block diagram of one embodiment of a DOCL layer 1 (L1) cache 350. In one embodiment, the L1 cache 350 includes two types of list: Recency-based eviction lists 352; and frequency-based eviction lists 354. In addition, the L1 cache 350 includes the fingerprint-based L1 hash table 306. The recency-based eviction lists 352 are used to track objects being added to the cache and include an eviction list for data objects 360 and metadata objects 358. In one embodiment, data objects 360 are data that is stored in the cache and metadata objects 358 is data about these stored objects. As the objects are read, they are initially promoted to the recency list (e.g., a Most Recently Used (MRU) list). In one embodiment, the frequency-based eviction lists are used to track accesses to objects in the cache and include an eviction list for data objects 364 and metadata objects 362. If this object is accessed within a certain time period again, the object is promoted to the frequency list (e.g., a Most Frequently Used (MFU) list.). In one embodiment, the L1 cache includes the fingerprint-based L1 hash table. In this embodiment, the fingerprint-based L1 hash table 356 is used to index the object as well as de-duplicate the object in the L1 cache 350. By using a fingerprint-based L1 hash table 356, one instance of the object is stored in the L1 cache 356, which eliminates the need for cache coherency and issues and the need to perform cache invalidation. In one embodiment, where cache is indexed by the logical address, an update to an object would require invalidating its cached copy becomes the same logical address would map to a different content. In one embodiment, invalidation is marking the cached copy of an object if it is no longer valid, whereas eviction is evicting a valid or an invalid cached object to create room for new contents. In one embodiment, a hotness/coldness of an object measures how recently the object was added or accessed by the StorFS system. In this embodiment, an object that has not been recently added or accessed can be a candidate for eviction from the L1 cache. In one embodiment, an object that has not been recently added or accessed can be considered "cold" or "stale" and is an object that is one that can be evicted from the L1 cache. In one embodiment, eviction from and updates to the L1 cache is at the object granularity.

Figure 4:
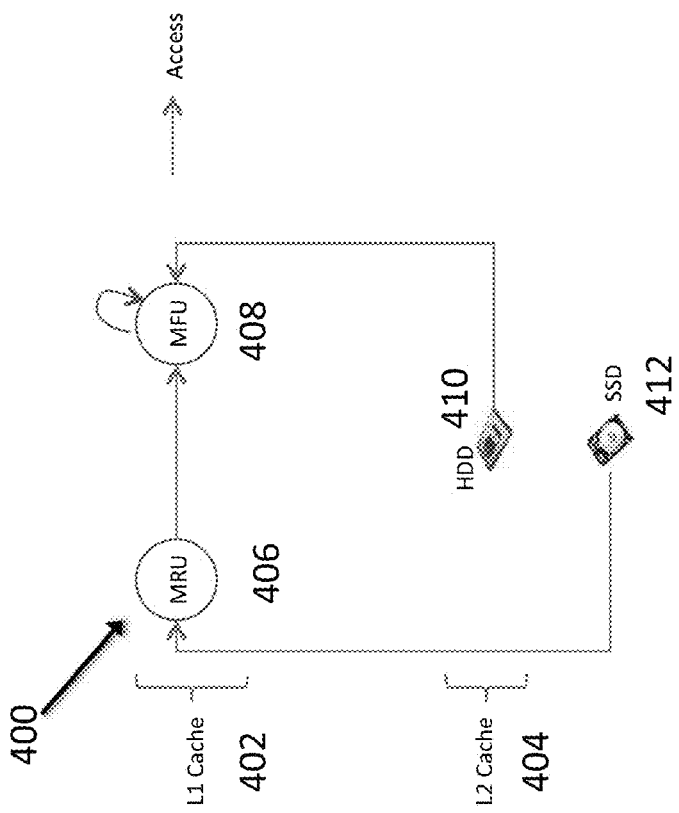
FIG. 4 is an illustration of one embodiment of a cache replacement logic.

In one embodiment, because the DOCL is a multi-layer cache, the StorFS will keep track of which objects should be retained in each of the DOCL layers and which objects should be evicted form these layers. In addition, an object may be promoted from one layer to another. In one embodiment, the DOCL takes into account both recency and/or frequency of an object to determine the objects that need to be evicted from the cache or cache layer. In one embodiment, recency means how long ago (or how soon) was an object accessed and frequency means that the object was accessed more than once in a specified time period threshold before moving from recency to the frequency-based list. Objects with an earlier time being added or accessed are less likely to be evicted from the cache than an object added to the cache a longer time ago or not having been accessed as recently. As the objects are read, they are initially promoted to the recency list (e.g., a Most Recently Used (MRU) list). If this object is accessed within a certain time period again, the object is promoted to the frequency list (e.g., a Most Frequently Used (MFU) list.). FIG. 4, below, illustrates the state machine for different L1 cache modes. In one embodiment, this state machine only represents the most common transition paths. In certain scenarios (cache not full, metadata to data ratio is reached), there may be a slight divergence.

FIG. 4 is an illustration of one embodiment of a cache replacement state machine 400. In one embodiment, the state machine 400 includes states of an object that is stored in SSD 412, L2 cache 404, L1 cache, and HDD 410. In one embodiment, the SSD 412 and HDD 410 represent the tier 1 and tier 2 storage of the Distributed Objects Layer of the StorFS system. For example and in one embodiment, the tier 1 storage provides fast low latency access and hosts DOCL L2 cache, a write log, etc. and the tier 2 storage is a persistent store as described in U.S. patent application Ser. No. 14/135,494, entitled "System and methods of a Hybrid write cache for distributed and scale-out storage appliances", filed on Dec. 19, 2013. In another embodiment, there can be a non-volatile random access memory-based tier 1 for a write log, an SSD or PCIe flash based tier 2 for the DOCL, and/or a HDD or SSD based tier 3 for persistent storage. In a further embodiment, there can less or more storage tiers for the DOCL and/or Distributed Objects Layer using a variety of different storage mediums. In one embodiment, the L1 cache 402 and L2 cache 404 are the caches as described in FIGS. 3 and 5, respectively.

In one embodiment, an object is initially read from the SSD 412 or the HDD 410 and added to the L1 cache 402. In one embodiment, the L1 cache 402 includes a MRU list 406 and MFU list 408. In this embodiment, the MRU list 406 is the most recently used list and the MFU list 408 is the most frequently used list as described in FIG. 3 above. In one embodiment, upon access, the object is added to the MRU list 406. If the object is not accessed again while in the MRU list 406, the object will go stale and be evicted from the MRU list 406. If the object is accessed, the object is moved to the MFU list 408. In one embodiment, if the object is not accessed while in the MFU list 408, the object can grow stale and be evicted from the MFU list 408. If the object is accessed, the object is refreshed in the MFU list 408 and less likely to be evicted from the L1 cache 402. In one embodiment, the end of MRU and the MFU lists are scanned for objects that are most likely to be evicted out from the L1 cache and copied to the L2 cache if they are not present there already.

As mention above, because the objects in the L1 and L2 caches are indexed by fingerprint and are de-duplicated, there is not a need for cache invalidation. As an object gets modified, the entry corresponding to that object in the cache need to be neither invalidated nor modified. In one embodiment, because the DOCL L1 and L2 caches are indexed by fingerprint, there is no need to invalidate the cache. In this embodiment, a modified object will have a new fingerprint because the content of the object has changed. Older version of the object will eventually become cold and be evicted out from cache.

In one embodiment, cached objects in L1 are reference counted to make sure that referenced objects are not evicted out. In this embodiment, reference counting means adding a reference for each instance the object is referred to in the cache. For example and in one embodiment, if two users simultaneously access a cached object, there will two references counted for this object. In one embodiment, when a cached object is referenced, the object's reference count is increased and it is temporarily removed from the MRU/MFU lists. In this embodiment, the object entry in the cache index is left as it is. This allows subsequent lookups to succeed. When the object's user returns the reference, the reference count is decremented. Once the reference count drops to zero, the object is inserted back in the appropriate list.

In one embodiment, the DOCL is in essence a distributed cache without distributed coordination. In this embodiment, there is a separate DOCL for each of the physical nodes in the StorFS system. In one embodiment, there is a separate DOCL for each of the storage controller servers 104A-C as described in FIG. 1 above. Because each DOCL instance serves the I/O requests that are local to its nodes, there is no need for a distributed coordination of the different DOCL caches. In this embodiment, the I/O requests are directed to the appropriate storage nodes using a deterministic routing logic that distributes the I/O load uniformly across the cluster as described above. As a result, there are no cache coherency issues.

As described above, the DOCL can include a L2 cache. In one embodiment, the L2 cache does not use a full in-memory hash-table for indexing the objects in the L2 cache. This is because the size of the metadata to index the cache can be prohibitively large for indexing a large number of small sized objects. Instead, in one embodiment, the StorFS system uses an on-disk index to perform L2 index lookup. For example and in one embodiment, the size of the L1 cache can be of the order of a few gigabytes (GBs). The L1 cache may be smaller or greater than a few GBs. This L1 size can be insufficient to store the entire working set of the StorFS workload. If the DOCL included just a L1 cache, a cache miss may result in an access to the persistent store, which is almost 1000 times slower for a persistent store access to HDD. Increasing the size of L1 cache boost performance, but it also increases the cost. For cost and performance considerations, the DOCL can include a L2 cache. In one embodiment, the L2 cache is an SSD based cache. In this embodiment, SSD have greater performance than HDDs that may be used for persistent store and are less expensive than a DRAM based cache such as the L1 cache.

In one embodiment, any type of SSD can be used for the L2 cache (single level cell (SLC), multi-level cell (MLC), or another type of SSD). In one embodiment, a MLC SSD is suitable for L2 cache for multiple reasons: the MLC SSD provides fast random/sequential reads, fast sequential writes, low power consumption, large size, lower cost than DRAM, etc. However, in this embodiment, MLC SSDs also have a few nuances, which make an MLC SSD-based L2 cache harder to use like a regular DRAM-based cache. This is because an MLC SSD can have slower random write performance and limited write erase cycles (e.g., ~5K for MLC SSD). In one embodiment, random writes are slow because SSD blocks need to be erased before data can be written on to them. In this embodiment, the DOCL L2 cache algorithm is designed to harness the random read performance of SSD, while trying to minimize the number of write erase cycles.

Figure 5:
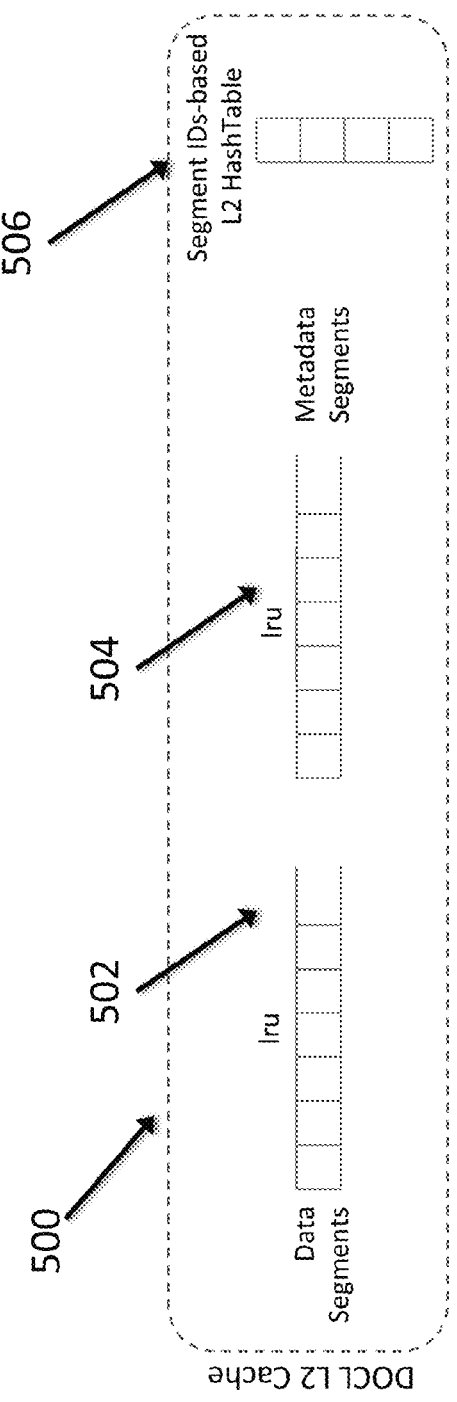
FIG. 5 is a block diagram of one embodiment of a DOCL layer 2 (L2) cache.

FIG. 5 is a block diagram of one embodiment of a DOCL layer 2 (L2) cache 500. In one embodiment, the L2 cache 500 is managed at the segment level instead of the object level. This allows the granularity of the allocation and the eviction for the L2 cache 500 is at the segment level. In one embodiment, a segment is the logical unit of storage allocation by the underlying StorFS's Log-based Block Management Layer. In one embodiment, the block management layer is further described in the co-pending U.S. patent application Ser. No. 14/135,485, entitled "System And Methods For Implementing An Enterprise-Class Converged Compute-Network-Storage Infrastructure," filed on Dec. 19, 2013. In this embodiment, segments can be one megabyte (MB) in size and the segments are multiples of "erase cycle blocks" of the underlying physical media (e.g., the SSD). This means that once a segment is allocated, and possibly after performing an erase, no more erases required until the segment is fully written with the objects' contents.

In one embodiment, the L2 cache includes a segment least recently used (LRU) list 508 that keeps track of the hotness of the segments and a segment identifier-based L2 hash table 506. In one embodiment, a hotness of a segment measures how recently a segment was added or accessed by the StorFS system. In this embodiment, a segment that has not been recently added or accessed can be a candidate for eviction from the L2 cache. In one embodiment, a segment that has not been recently added or accessed can be considered "cold" or "stale" and that is one that can be evicted from the L2 cache. The LRU list 508 further includes an LRU list for data segments 502 and metadata segments 504. In one embodiment, the data segments 502 are segments to store data in the cache and metadata segments 504 are segments to store data about these stored objects. In one embodiment, the segment identifier-based L2 hash table 506 that is used to index the segments. In one embodiment, eviction from and updates to the L2 cache is at the segment granularity. In another embodiment, the L2 cache is a de-duplicated cache.

As discussed above, it can be expensive to index a large SSD cache at the object granularity. For example and in one embodiment, the total memory required to store cache metadata at 4K object granularity for a 256 GB L2 cache is ~8 GBs. To address this issue, the StorFS system manages the L2 cache at the "segment" level instead of at the object level. In this embodiment, the granularity of allocation and eviction for L2 cache is a full segment. For a 1 MB segment, the total L2 cache metadata in the memory is now reduced to 25 MB. In one embodiment, the segment is the logical unit of storage allocation by the underlying StorFS's Log-based Block Management Layer. In one embodiment, segments are typically 1 MB in size and are multiple of "erase cycle blocks". This means that once a segment is allocated (probably after performing an erase), there are no more erases required until the segment is fully written with the objects' contents. In alternate embodiments, the segments can be larger or smaller in size.

In one embodiment, the StorFS system uses the L2 cache in tandem with the L1 cache for a multi-layer DOCL. In one embodiment, the L2 cache works as follows: On L1 cache miss, the object is looked in the L2 cache. If there is a hit, the object is read and promoted to the MFU list in the L1 cache. If there is a miss, the object is read from StorFS persistent store and promoted to the MRU list in the L1 cache. In one embodiment, there is no eviction path from L1 to L2. Instead, an "L1_scanner" asynchronously scans the MFU and MRU lists, and copy the objects from the end of those lists to the L2 cache. If the object exists in the L2 cache, the object is not added to the L2 cache.

In one embodiment, writes to the L2 cache are batched and performed asynchronously using a "KV_Put" interface. On successful object write, the KV_Put returns the segment ID and a key locator cookie. In one embodiment, the segment LRU list 508 keeps track of the hotness of the segments. The segment ID returned by the KV_Put is inserted in the head of the LRU list (if it is not already there). If the object that was copied from L1 to L2 still exists in the L1 cache, the corresponding segment ID and key cookie locator is inserted into its header. In one embodiment, the combination of the segment ID and key locator cookie provides a faster way to read the objects from L2 cache compared to the key (e.g., the fingerprint) as there is no on-SSD L2 index lookup involved.

In one embodiment, and in a steady state, the L2 cache will be full. In this state, a new segment write will have to first evict (e.g. clean) an existing segment, so there is room for the new segment. In one embodiment, the segment to evict is the one in the tail of the corresponding LRU list, depending whether the segment is a data segment or a metadata segment. As described above and in one embodiment, the L1 scanner writes those objects to the L2 cache that are not presently in L2 cache. For objects that were candidate for L2 writes, but already exist in L2 cache, the corresponding segment ID is brought to the head of the LRU list. This prevents duplicate writes to the SSD as well make sure that those segments do not get evicted from L2. As the unit of L2 eviction is segment and not individual objects, there is no need to perform L2 SSD cleaning and copying of live objects. The index entries associated with the objects in the segments being evicted still need to be removed, but that process incurs much less overhead.

Figure 6:
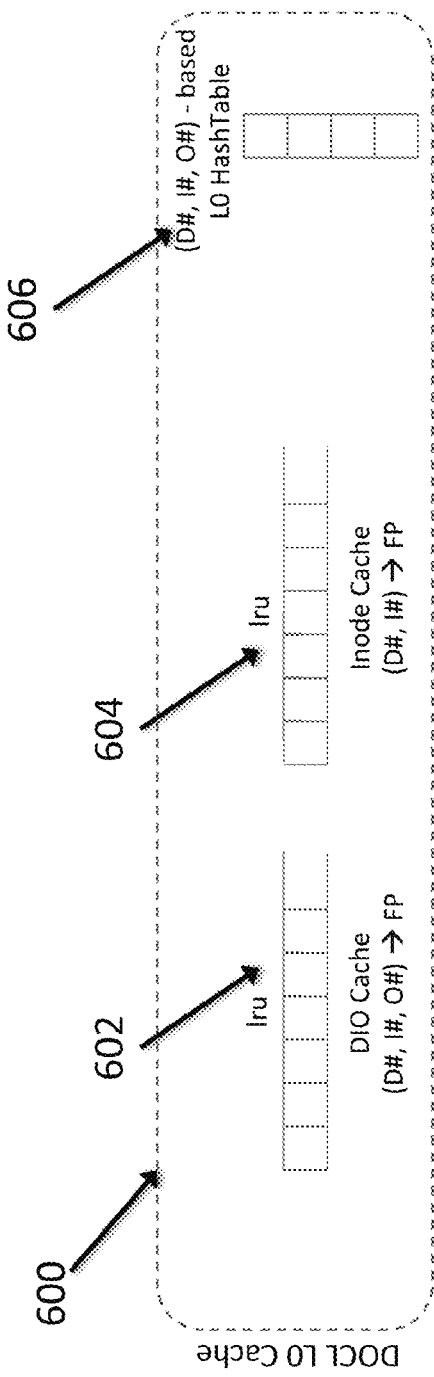
FIG. 6 is a block diagram of one embodiment of a DOCL layer 0 (L0) cache.

In one embodiment, the fingerprint of an object may not be known a priori. If the fingerprint is not known, the system may have to perform multiple metadata object accesses to determine the fingerprint of that data object. In this embodiment, any metadata access to access a data object is essentially an overhead. Minimizing the metadata access overhead can significantly increases the system performance. For that reason, in one embodiment, the StorFS system employs another caching layer in its cache hierarchy. FIG. 6 is a block diagram of one embodiment of a DOCL layer 0 (L0) cache 600. In this embodiment, the DOCL L0 cache is a mutable logical index cache that maintains a mapping of logical metadata to its fingerprint. The L0 cache maintains two types of logical metadata: an inode cache 604 that maintains a mapping of an inode number to the corresponding inode fingerprint; and a data index cache 602 that maintains a mapping of the logical file offset (<datastore id, inode number, logical offset>) to its corresponding data object's fingerprint. In this embodiment, for every data object access or inode access, the StorFS system first looks up in its L0 cache using a logical file offset based L0 hash table 606. If there is a matching entry, the StorFS system uses the fingerprint from the entry to access the corresponding data or inode object. If the entry is not there, the StorFS system traverses the entire chain of metadata starting from the superblock of the inode to access the desired object. In one embodiment, eviction from and updates to the L0 cache is at the object granularity.

As the files contents are modified, their corresponding logical entries in the DOCL L0 cache also needs to updated to reflect the current logical metadata to fingerprint mapping.

Figure 7:
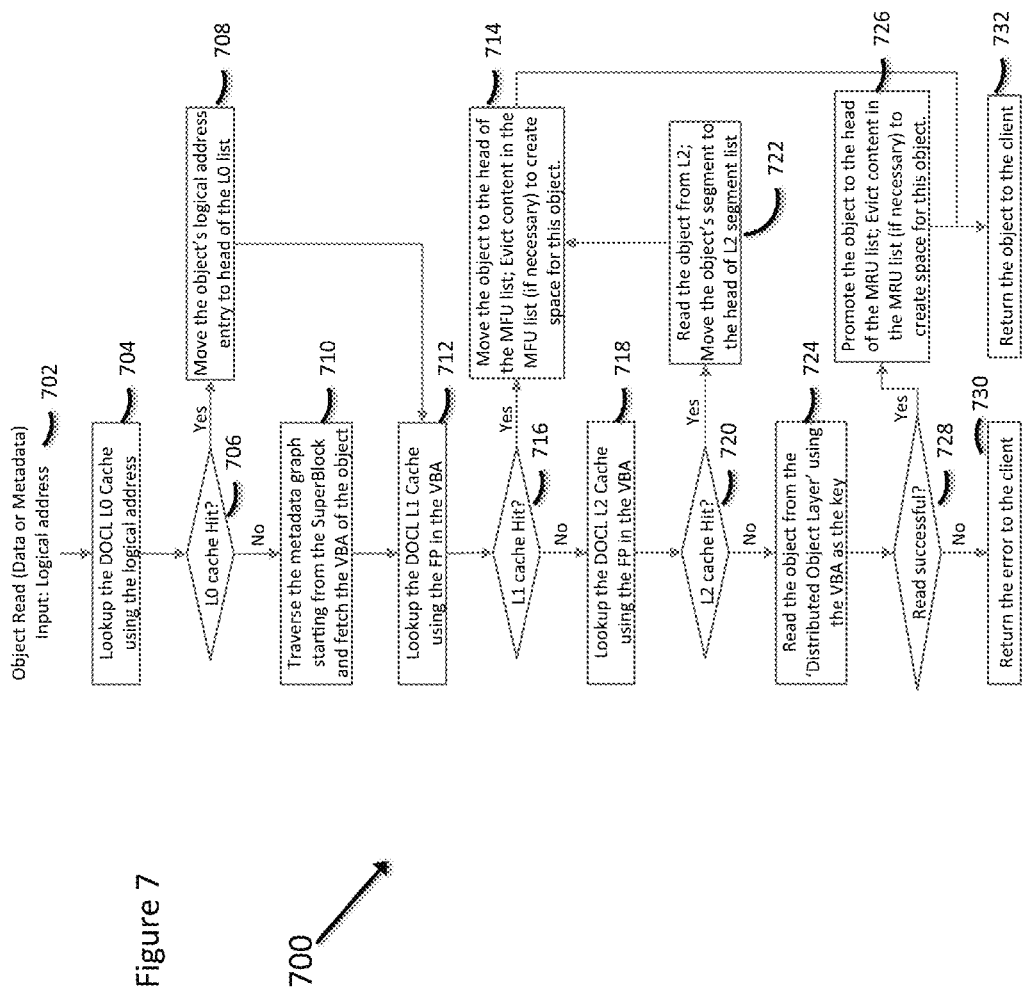
FIG. 7 is a flow diagram of one embodiment of a process to access an object using the DOCL.

As described above and in one embodiment, the DOCL is a multi-layer cache that is used by the StorFS system to provide quick access to objects in the cache. In one embodiment, the StorFS system first attempts to access an object in the cache. If the object is not in the cache, the StorFS system accesses the object from the Distributed Object Layer. FIG. 7 is a flow diagram of one embodiment of a process 700 to access an object using the DOCL. In one embodiment, DOCL 210 performs process 700 to access an object. In FIG. 7, process 700 begins by receiving an operation to access the object at block 702. In one embodiment, the access operation is a read operation. In another embodiment, the access operation can be a write operation where in the object is first persisted in the persistent storage and then inserted in to the L1 cache.

At block 704, process 700 looks up the DOCL L0 cache using the logical address that is inputted with the access operation. Process 700 determines if there is a L0 Cache hit at block 706. In one embodiment, a cache hit in the L0 cache means that object referenced by the access operation is stored in the L1 cache. If there is a cache hit, process 700 moves the logical address entry of the object to the head of the L0 list. In one embodiment, by moving the logical address entry of the object to the head of the L0 list, the object will not grow stale as quickly and will not be evicted as quickly. Execution proceeds to block 712 below.

If there is not a L0 cache hit, at block 710, process 700 traverses of the metadata graph starting from the superblock of the cache vNode to which the file stripe belongs and fetches the VBA of the object. At block 712, process 700 looks up the DOCL L1 cache using the fingerprint in the VBA of the object. In one embodiment, the fingerprint of the object is a hash of the object contents. Process 700 determines if there is a L1 cache hit for this object. If there is an L1 cache hit, process 700 moves the object to the head of the MFU list, which indicates that this object has been recently accessed. In addition, process 700 moves the contents in the MFU list, if necessary, to create space for this object. Execution proceeds to block 732 below.

If there is not an L1 cache hit, process 700 looks up the DOCL L2 cache using the fingerprint in the VBA of the object at block 716. At block 718, process 700 determines if there is an L2 cache hit. If there is an L2 cache hit, process 700 reads object from the L2 cache and moves the object's segment to the head of the L2 segment list. Execution proceeds to block 714 above. If there is not an L2 cache hit, process 700 reads the object from the distributed object layer using the VBA as the key at block 724. In one embodiment, the distributed object layer is the distributed object layer 218 as described in FIG. 2 above. At block 728, process 700 determines if the read was successful. If the read was not successful, process 700 returns an error to the client at block 730. If the read was successful, process 700 promotes the object to the head of the MRU list in the L1 cache at block 726. In addition, process 700 evicts the content in the MRU list, if necessary, to create space for this object. At block 732, process 700 returns the object to the client.

Figure 8:
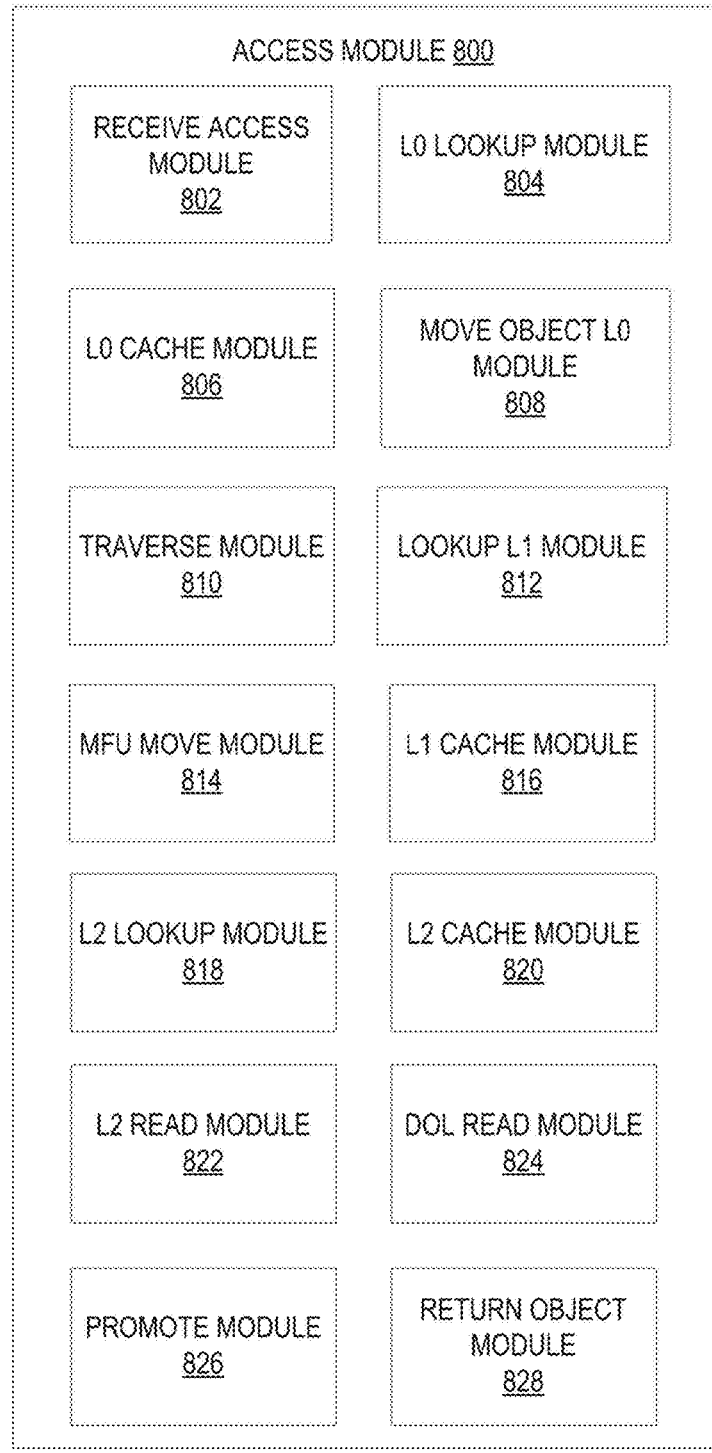
FIG. 8 is a block diagram of one embodiment of an access module that accesses an object using the DOCL.

FIG. 8 is a block diagram of one embodiment of a read module 800 that accesses an object using the DOCL. In one embodiment, a DOCL uses the read module to access objects from the DOCL, such as the DOCL 210 as described in FIG. 2 above. In one embodiment, the read module 800 includes receive access module 802, L0 lookup module 804, L0 cache module 806, move object L0 module 808, traverse module 810, lookup L1 module 812, MFU move module 814, L1 cache module 816, lookup L2 module 818, L2 cache module 820, L2 read module 822, DOL read module 824, promote module 826, and return object module 828. In one embodiment, the receive access module 802 receives the access operation as described above in FIG. 7 at block 702. The L0 lookup module 804 looks up the object in the L0 cache as described above in FIG. 7 at block 704. The L0 cache module 806 determines if there is L0 cache hit as described above in FIG. 7 at block 706. The move object L0 module 808 moves the logical address entry of the object as described above in FIG. 7 at block 708. The traverse module 810 traverses the metadata graph as described above in FIG. 7 at block 710. The lookup L1 module 812 looks up the object in the L1 cache as described above in FIG. 7 at block 712. The MFU move module 814 moves the object to the head of the MFU list as described above in FIG. 7 at block 714. The L1 cache module 816 determines if there is an L1 cache hit as described above in FIG. 7 at block 716. The L2 lookup module 818 looks up the object in the L2 cache as described above in FIG. 7 at block 718. The L2 cache module 820 determines if there is a L2 cache hit as described above in FIG. 7 at block 720. The L2 read module 822 reads the object from the L2 cache as described above in FIG. 7 at block 722. The DOL read module 824 reads the object from the distributed object layer as described above in FIG. 7 at block 724. The promote module 826 promotes the object as described above in FIG. 7 at block 726. The return object module 828 returns the object to the client as described above in FIG. 7 at block 732.

Figure 9:
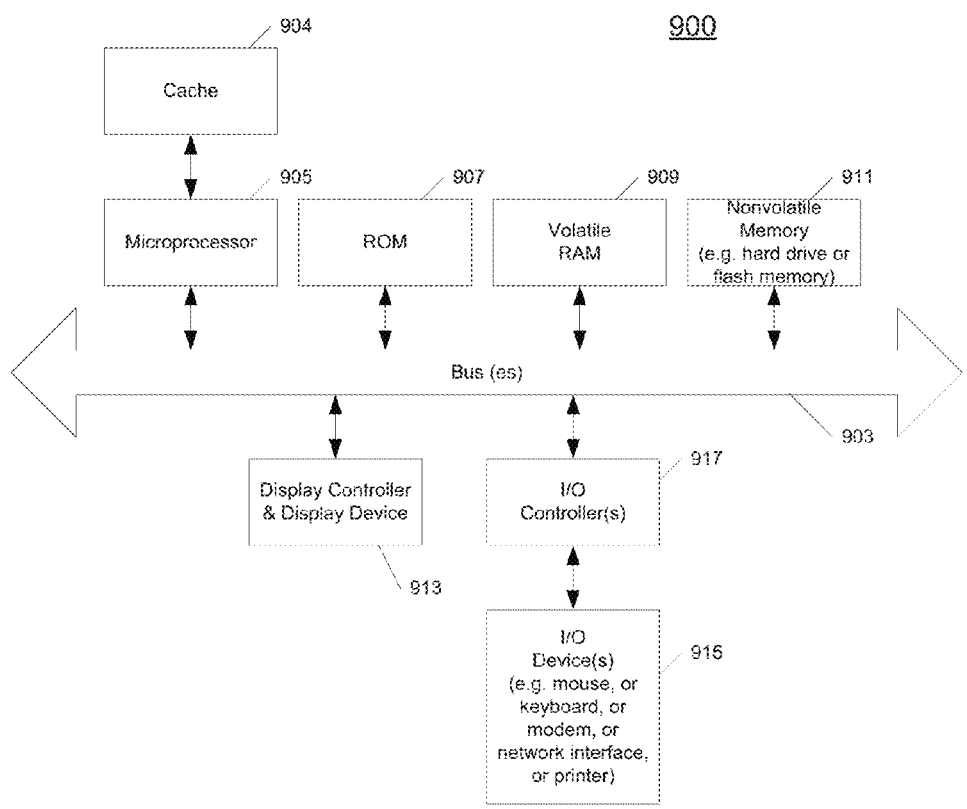
FIG. 9 illustrates one example of a typical computer system, which may be used in conjunction with the embodiments described herein.

FIG. 9 shows one example of a data processing system 900, which may be used with one embodiment of the present invention. For example, the system 900 may be implemented including a physical server 102A-C as shown in FIG. 1. Note that while FIG. 9 illustrates various components of a computer system, it is not intended to represent any particular architecture or manner of interconnecting the components as such details are not germane to the present invention. It will also be appreciated that network computers and other data processing systems or other consumer electronic devices, which have fewer components or perhaps more components, may also be used with the present invention.

FIG. 9 shows one example of a data processing system 900, which may be used with one embodiment of the present invention. For example, the system 900 may be implemented including a physical server 102A-C as shown in FIG. 1. Note that while FIG. 9 illustrates various components of a computer system, it is not intended to represent any particular architecture or manner of interconnecting the components as such details are not germane to the present invention. It will also be appreciated that network computers and other data processing systems or other consumer electronic devices, which have fewer components or perhaps more components, may also be used with the present invention.

As shown in FIG. 9, the computer system 900, which is a form of a data processing system, includes a bus 903 which is coupled to a microprocessor(s) 905 and a ROM (Read Only Memory) 907 and volatile RAM 909 and a non-volatile memory 911. The microprocessor 905 may retrieve the instructions from the memories 907, 909, 99 and execute the instructions to perform operations described above. The bus 903 interconnects these various components together and also interconnects these components 905, 907, 909, and 99 to a display controller and display device 913 and to peripheral devices such as input/output (I/O) devices which may be mice, keyboards, modems, network interfaces, printers and other devices which are well known in the art. Typically, the input/output devices 915 are coupled to the system through input/output controllers 917. The volatile RAM (Random Access Memory) 909 is typically implemented as dynamic RAM (DRAM), which requires power continually in order to refresh or maintain the data in the memory.

The mass storage 911 is typically a magnetic hard drive or a magnetic optical drive or an optical drive or a DVD RAM or a flash memory or other types of memory systems, which maintain data (e.g. large amounts of data) even after power is removed from the system. Typically, the mass storage 99 will also be a random access memory although this is not required. While FIG. 9 shows that the mass storage 911 is a local device coupled directly to the rest of the components in the data processing system, it will be appreciated that the present invention may utilize a non-volatile memory which is remote from the system, such as a network storage device which is coupled to the data processing system through a network interface such as a modem, an Ethernet interface or a wireless network. The bus 903 may include one or more buses connected to each other through various bridges, controllers and/or adapters as is well known in the art.

Portions of what was described above may be implemented with logic circuitry such as a dedicated logic circuit or with a microcontroller or other form of processing core that executes program code instructions. Thus processes taught by the discussion above may be performed with program code such as machine-executable instructions that cause a machine that executes these instructions to perform certain functions. In this context, a "machine" may be a machine that converts intermediate form (or "abstract") instructions into processor specific instructions (e.g., an abstract execution environment such as a "process virtual machine" (e.g., a Java Virtual Machine), an interpreter, a Common Language Runtime, a high-level language virtual machine, etc.), and/or, electronic circuitry disposed on a semiconductor chip (e.g., "logic circuitry" implemented with transistors) designed to execute instructions such as a general-purpose processor and/or a special-purpose processor. Processes taught by the discussion above may also be performed by (in the alternative to a machine or in combination with a machine) electronic circuitry designed to perform the processes (or a portion thereof) without the execution of program code.

The present invention also relates to an apparatus for performing the operations described herein. This apparatus may be specially constructed for the required purpose, or it may comprise a general-purpose computer selectively activated or reconfigured by a computer program stored in the computer. Such a computer program may be stored in a computer readable storage medium, such as, but is not limited to, any type of disk including floppy disks, optical disks, CD-ROMs, and magnetic-optical disks, read-only memories (ROMs), RAMs, EPROMs, EEPROMs, magnetic or optical cards, or any type of media suitable for storing electronic instructions, and each coupled to a computer system bus.

A machine readable medium includes any mechanism for storing or transmitting information in a form readable by a machine (e.g., a computer). For example, a machine readable medium includes read only memory ("ROM"); random access memory ("RAM"); magnetic disk storage media; optical storage media; flash memory devices; etc.

An article of manufacture may be used to store program code. An article of manufacture that stores program code may be embodied as, but is not limited to, one or more memories (e.g., one or more flash memories, random access memories (static, dynamic or other)), optical disks, CD-ROMs, DVD ROMs, EPROMs, EEPROMs, magnetic or optical cards or other type of machine-readable media suitable for storing electronic instructions. Program code may also be downloaded from a remote computer (e.g., a server) to a requesting computer (e.g., a client) by way of data signals embodied in a propagation medium (e.g., via a communication link (e.g., a network connection)).

The preceding detailed descriptions are presented in terms of algorithms and symbolic representations of operations on data bits within a computer memory. These algorithmic descriptions and representations are the tools used by those skilled in the data processing arts to most effectively convey the substance of their work to others skilled in the art. An algorithm is here, and generally, conceived to be a self-consistent sequence of operations leading to a desired result.

The operations are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be kept in mind, however, that all of these and similar terms are to be associated with the appropriate physical quantities and are merely convenient labels applied to these quantities. Unless specifically stated otherwise as apparent from the above discussion, it is appreciated that throughout the description, discussions utilizing terms such as "receiving," "determining," "accessing," "computing," "evicting," "performing," "generating," "communicating," "reading," "writing," "transferring," "updating," "scanning," "compacting," or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

The processes and displays presented herein are not inherently related to any particular computer or other apparatus. Various general-purpose systems may be used with programs in accordance with the teachings herein, or it may prove convenient to construct a more specialized apparatus to perform the operations described. The required structure for a variety of these systems will be evident from the description below. In addition, the present invention is not described with reference to any particular programming language. It will be appreciated that a variety of programming languages may be used to implement the teachings of the invention as described herein.

The foregoing discussion merely describes some exemplary embodiments of the present invention. One skilled in the art will readily recognize from such discussion, the accompanying drawings and the claims that various modifications can be made without departing from the spirit and scope of the invention.

What is claimed is:

1. A non-transitory machine-readable medium having executable instructions to cause one or more processing units to perform a method to access an object stored in a cache of a distributed storage system, the method comprising:
   determining if the object is in the cache that stores a plurality of objects, wherein the distributed storage system includes the cache and a distributed object layer for persistently storing the plurality of objects in each of the plurality of storage controller servers of the distributed storage system, the cache is a multi-layer cache and further includes a de-duplicated layer 1 and 2 cache, a granularity of allocation for the layer 1 and 2 caches is different, and writes to the layer 2 cache are done at a segment granularity and reads from the layer 2 cache are done at the object granularity;
   if the object is in the cache, accessing the object from the cache; and
   if the object is not in the cache, accessing the object from the distributed object layer.

2. The non-transitory machine-readable medium of claim 1, wherein the de-duplicated layer 1 cache is indexed by a fingerprint of contents of the object.

3. The non-transitory machine-readable medium of claim 1, wherein the de-duplicated layer 1 cache is stored in dynamic random access memory.

4. The non-transitory machine-readable medium of claim 1, wherein the layer 2 cache stores an object in storage that is selected from the group consisting of a solid state drive and a Peripheral Component Interconnect Express Flash.

5. The non-transitory machine-readable medium of claim 1, wherein the layer 2 cache is stored by segment and is indexed by a fingerprint of contents of each segment.

6. The non-transitory machine-readable medium of claim 1, wherein the eviction and updates from and to the layer 2 cache is done at a segment granularity.

7. The non-transitory machine-readable medium of claim 1, wherein the cache further includes a layer 0 cache and the layer 0 cache is a mutable index cache and maintains a mapping of logical metadata to the fingerprint.

8. The non-transitory machine-readable medium of claim 1, further comprising:
   evicting the object from the cache if the object has not been accessed recently.

9. The non-transitory machine-readable medium of claim 8, wherein the eviction and updates from and to the layer 0 and the layer 1 caches are done at an object granularity.

10. A computerized method that accesses an object stored in a cache of a distributed storage system, the method comprising:
    determining if the object is in the cache that stores a plurality of objects, wherein the distributed storage system includes the cache and a distributed object layer for persistently storing the plurality of objects in each of the plurality of storage controller servers of the distributed storage system, the cache is a multi-layer cache and further includes a de-duplicated layer 1 and 2 cache, a granularity of allocation for the layer 1 and 2 caches is different, and writes to the layer 2 cache are done at a segment granularity and reads from the layer 2 cache are done at the object granularity;
    if the object is in the cache, accessing the object from the cache; and
    if the object is not in the cache, accessing the object from the distributed object layer.

11. The computerized method of claim 10, wherein the de-duplicated layer 1 cache is indexed by a fingerprint of contents of the object.

12. The computerized method of claim 10, wherein the eviction and updates from/to the layer 2 cache is done at the segment granularity.

13. The computerized method of claim 10, wherein the cache further includes a layer 0 cache and the layer 0 cache is a mutable index cache and maintains a mapping of logical metadata to its fingerprint.

14. The computerized method of claim 10, wherein the eviction and updates from/to the layer 0 and the layer 1 caches are done at an object granularity.

15. A distributed storage system to access an object in a cache of a distributed storage system, the distributed storage system comprising:
    an interconnection network; and
    a plurality of storage controllers, interconnected by the interconnection network, wherein each of the plurality of storage controllers includes,
      a distributed object layer that persistently stores a plurality of objects, and
      a distributed object caching layer, coupled to the distributed object layer, that accesses the object in the distributed storage system, the distributed object caching layer including, the cache that is a multi-layer cache and further includes a de-duplicated layer 1 and 2 cache, a granularity of allocation for the layer 1 and 2 caches is different, and writes to the layer 2 cache are done at a segment granularity and reads from the layer 2 cache are done at the object granularity;

an access module, comprising a set of instructions, coupled to the cache, that determines if the object is in the cache, if the object is in the cache, the access module accesses the object from the cache, and if the object is not in the cache, the access module accesses the object from the distributed object layer.

* * * * *